(12) United States Patent
Lee et al.

(10) Patent No.: US 9,230,896 B2
(45) Date of Patent: Jan. 5, 2016

(54) SEMICONDUCTOR DEVICE AND METHOD OF REFLOW SOLDERING FOR CONDUCTIVE COLUMN STRUCTURE IN FLIP CHIP PACKAGE

(75) Inventors: Chien Chen Lee, Taiwan (TW); Li Chiun Hung, Zhudong Township (TW)

(73) Assignee: STATS ChipPAC, Ltd., Singapore (SG)

( * ) Notice: Subject to any disclaimer, the term of this patent is extended or adjusted under 35 U.S.C. 154(b) by 50 days.

(21) Appl. No.: 13/489,143

(22) Filed: Jun. 5, 2012

(65) Prior Publication Data
US 2013/0320523 A1    Dec. 5, 2013

(51) Int. Cl.
| | |
|---|---|
| H01L 21/00 | (2006.01) |
| H01L 23/498 | (2006.01) |
| H01L 23/00 | (2006.01) |
| H01L 23/31 | (2006.01) |
| H01L 21/56 | (2006.01) |
| H01L 21/50 | (2006.01) |

(52) U.S. Cl.
CPC .......... *H01L 23/49811* (2013.01); *H01L 21/50* (2013.01); *H01L 21/561* (2013.01); *H01L 21/565* (2013.01); *H01L 21/568* (2013.01); *H01L 23/3121* (2013.01); *H01L 23/3128* (2013.01); *H01L 23/562* (2013.01); *H01L 24/75* (2013.01); *H01L 24/81* (2013.01); *H01L 24/97* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01); *H01L 2924/01322* (2013.01); *H01L 2924/12041* (2013.01); *H01L 2924/1306* (2013.01); *H01L 2924/13091* (2013.01); *H01L 2924/15311* (2013.01)

(58) Field of Classification Search
CPC ................. H01L 2924/00014; H01L 2924/00; H01L 2224/73204; H01L 2224/16225; H01L 2224/32225
USPC .......................................... 438/127; 257/737
IPC ....... H01L 21/56,23/498, 2924/00, 2924/00014
See application file for complete search history.

(56) References Cited

U.S. PATENT DOCUMENTS

| | | | |
|---|---|---|---|
| 5,721,451 A | 2/1998 | Settles et al. | |
| 6,219,911 B1 | 4/2001 | Estes et al. | |
| 6,334,569 B1 | 1/2002 | Yoshimura | |
| 6,619,531 B1 | 9/2003 | Yamaoka | |
| 6,998,293 B2 | 2/2006 | Achari et al. | |
| 7,262,079 B2 * | 8/2007 | Xie | 438/108 |
| 7,795,075 B2 * | 9/2010 | Uemura et al. | 438/108 |
| 2010/0203675 A1 * | 8/2010 | Nakatani et al. | 438/108 |
| 2011/0149537 A1 * | 6/2011 | Kurosawa | 361/760 |
| 2011/0193220 A1 | 8/2011 | Kuo et al. | |

* cited by examiner

*Primary Examiner* — Tony Tran
(74) *Attorney, Agent, or Firm* — Robert D. Atkins; Patent Law Group: Atkins and Associates, P.C.

(57) ABSTRACT

A semiconductor device comprises a substrate and a semiconductor die. Bumps are formed over the substrate or a first surface of the semiconductor die. Conductive columns devoid of solder are formed over the substrate or the first surface of the semiconductor die. The semiconductor die is disposed over the substrate. A collet including a first cavity and a second cavity formed in a surface of the first cavity is mounted over the semiconductor die with a second surface of the semiconductor die opposite the first surface disposed within the first cavity. The bumps are reflowed. A force is applied to the collet to hold the bumps to the conductive columns while reflowing the bumps to make electrical connection to the conductive columns. The collet is removed. An underfill material is deposited between the semiconductor die and substrate. An encapsulant is deposited over the semiconductor die and substrate.

13 Claims, 15 Drawing Sheets

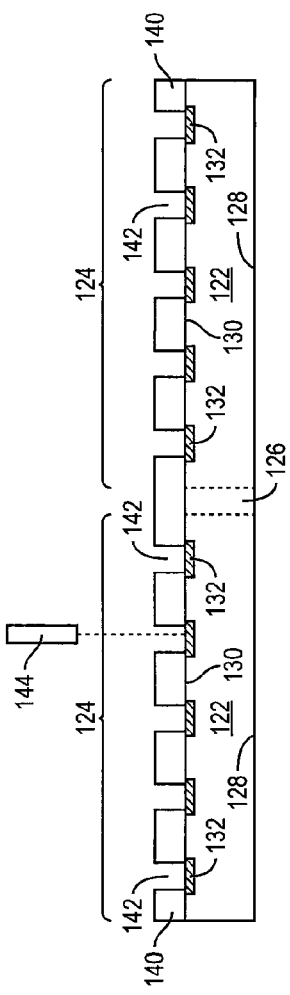
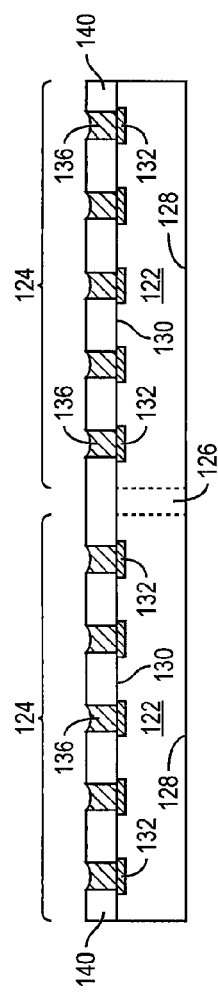
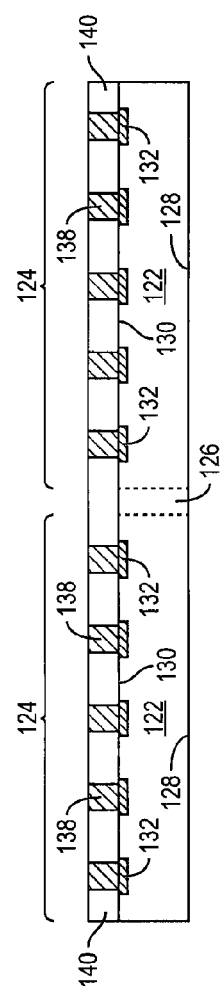
FIG. 3c
FIG. 3d
FIG. 3e

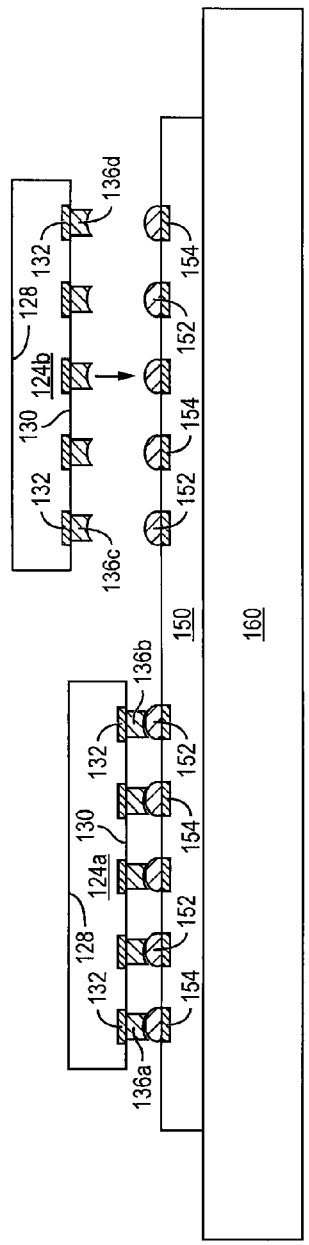
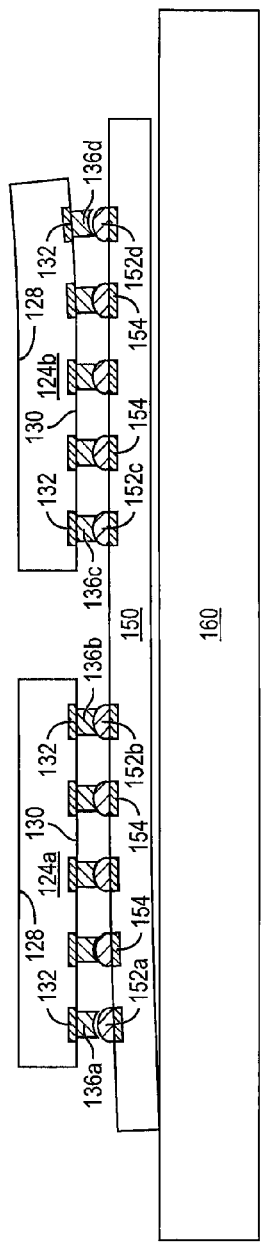
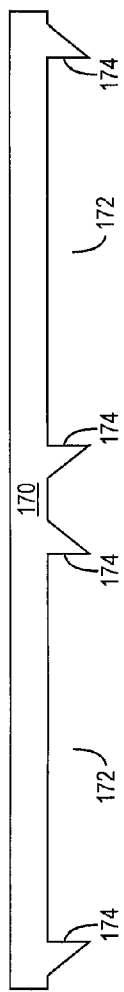
FIG. 4b
FIG. 4c
FIG. 4d

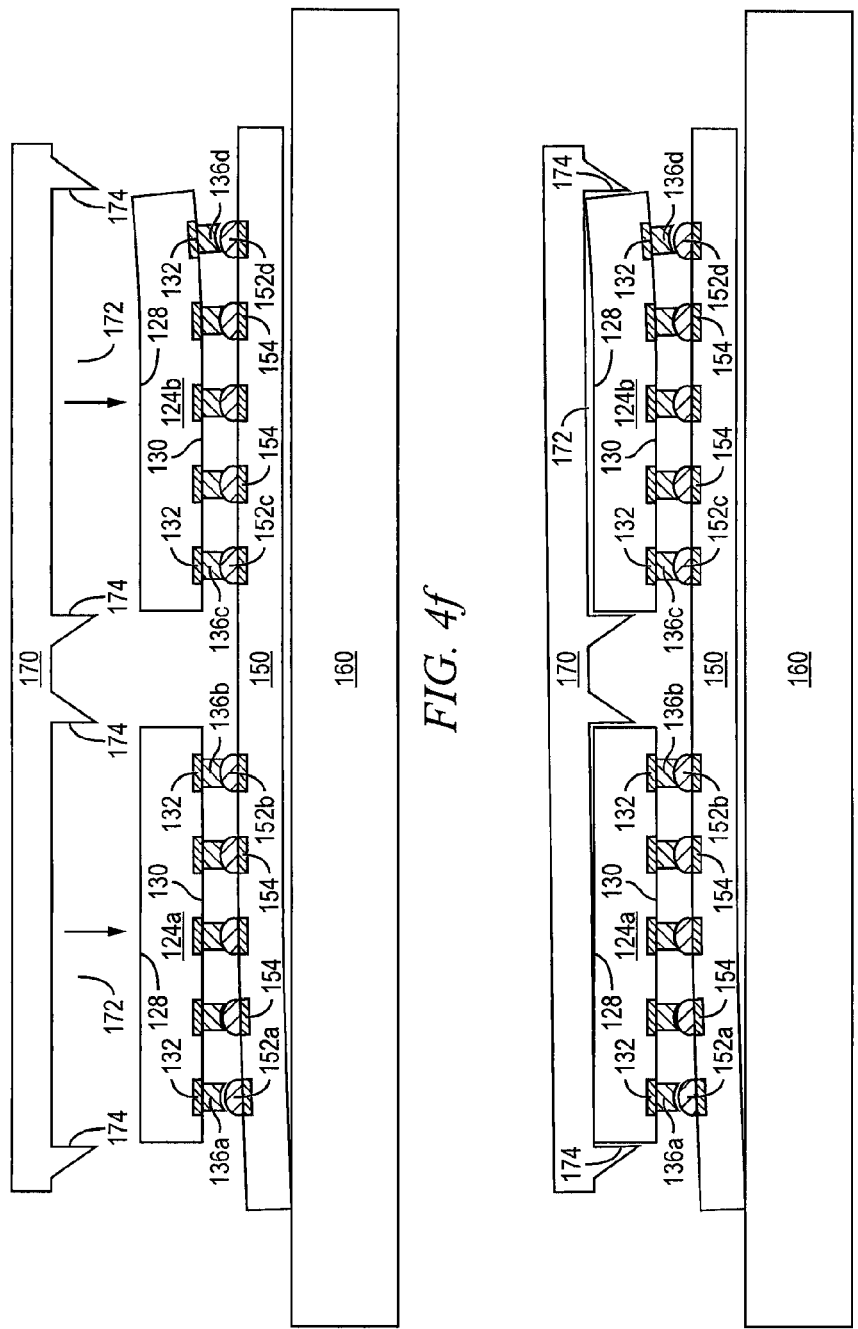

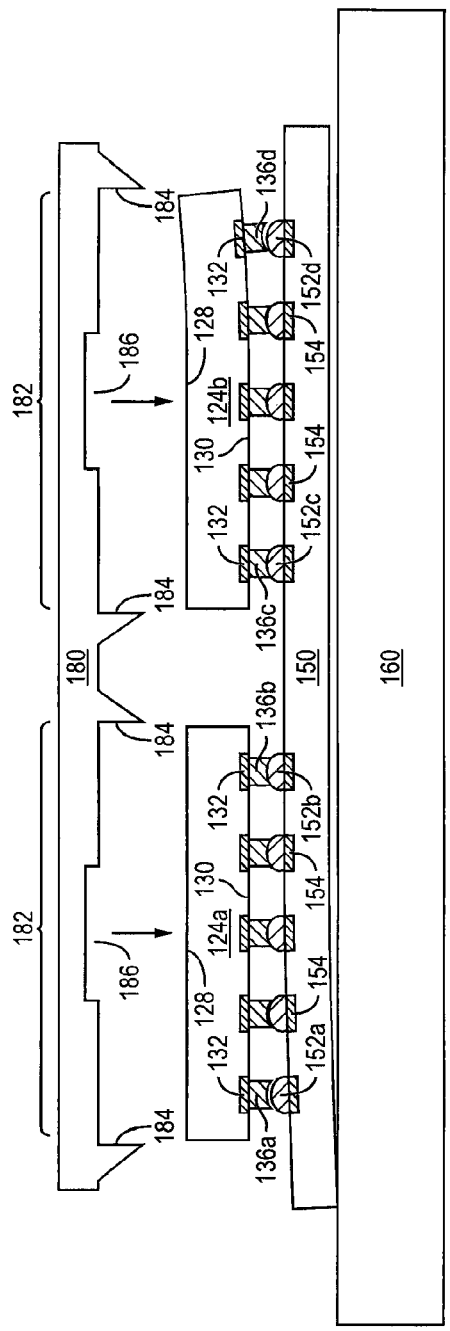
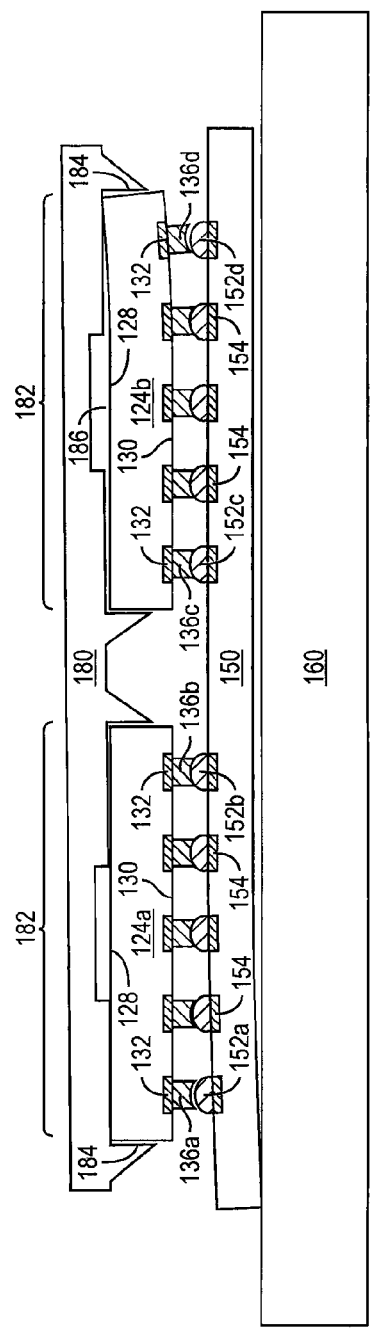

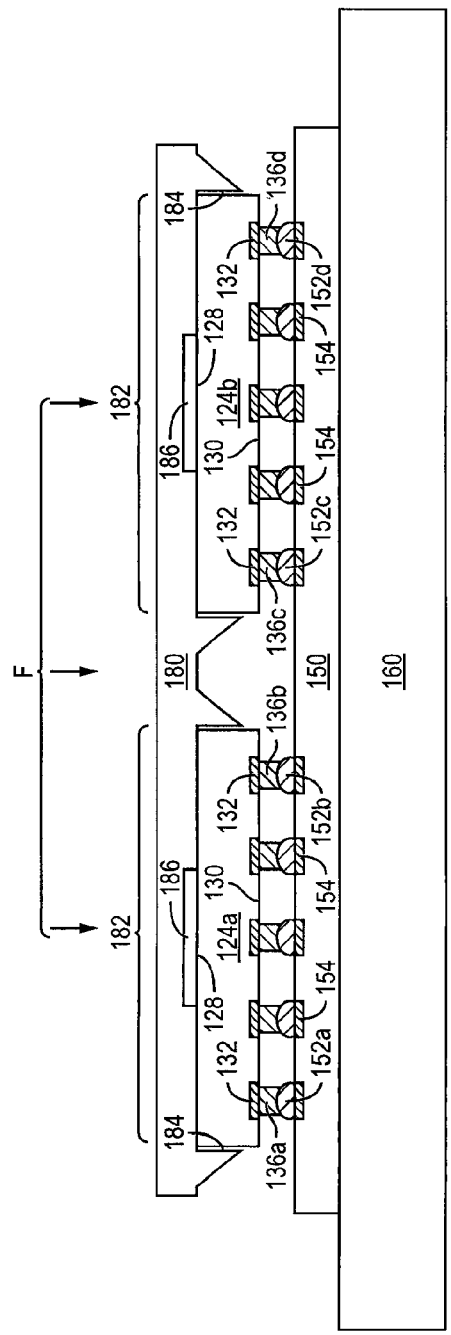
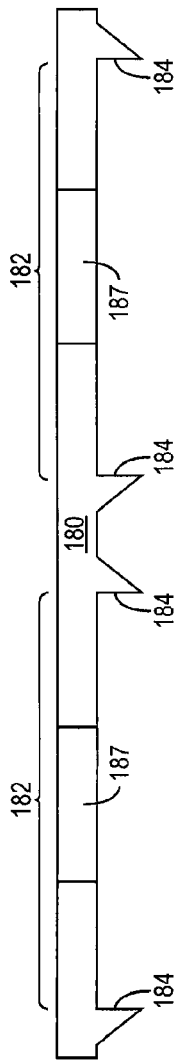
FIG. 6c
FIG. 6d

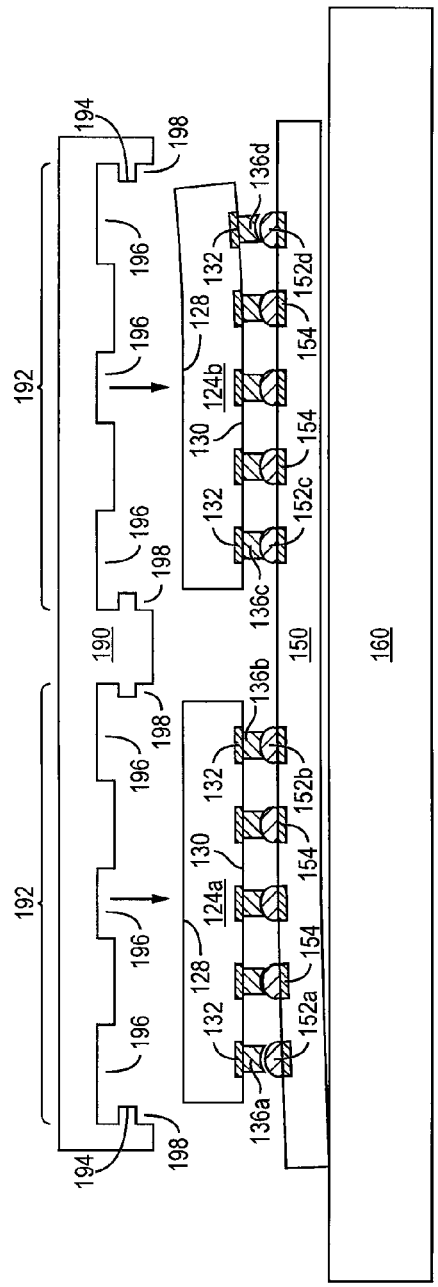
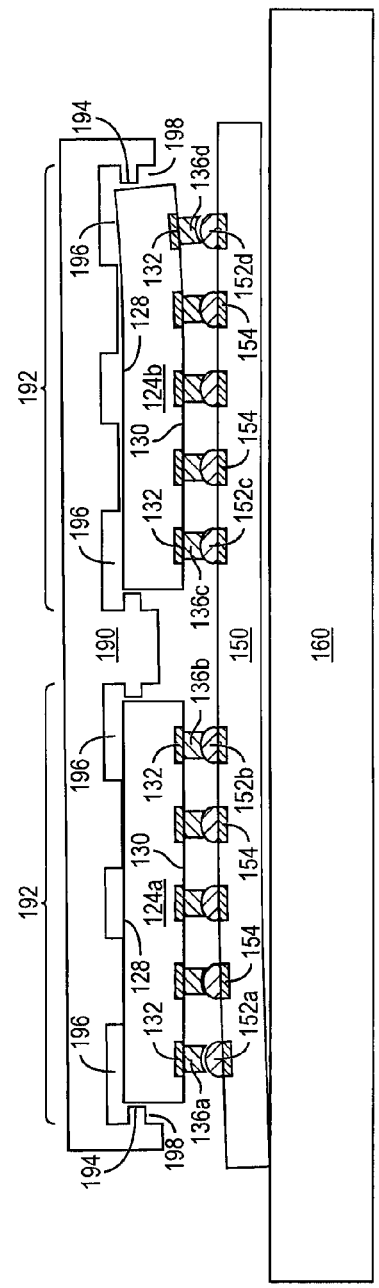
FIG. 7a
FIG. 7b

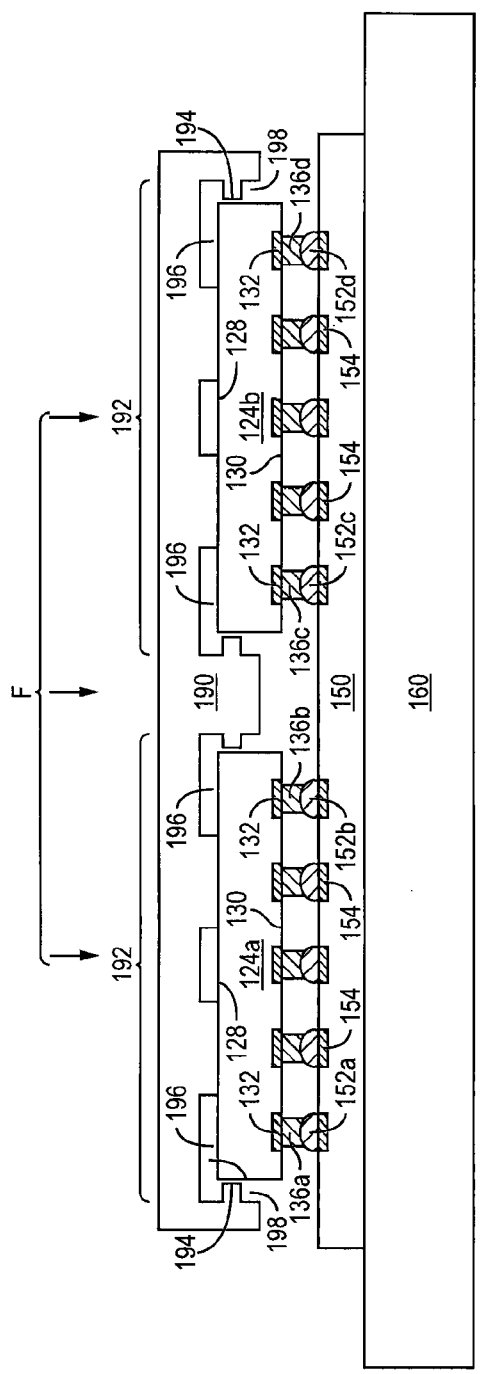
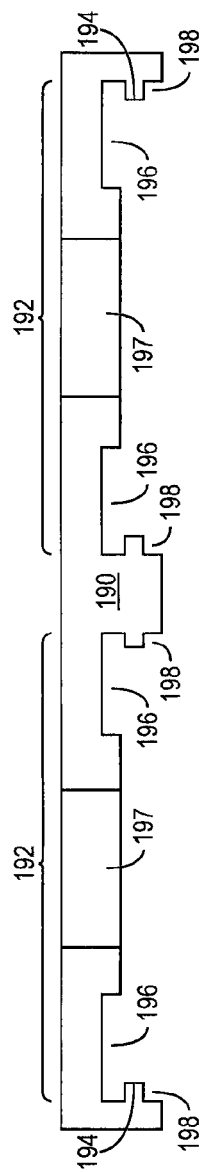
FIG. 7c
FIG. 7d

SEMICONDUCTOR DEVICE AND METHOD OF REFLOW SOLDERING FOR CONDUCTIVE COLUMN STRUCTURE IN FLIP CHIP PACKAGE

FIELD OF THE INVENTION

The present invention relates in general to semiconductor devices and, more particularly, to a semiconductor device and method of connecting conductive columns of a semiconductor device to a substrate to form a flip-chip device.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

To produce thinner semiconductor devices, thinner semiconductor die or thinner substrates may be used. Thinner semiconductor die and thinner substrates are more susceptible to warpage during manufacturing. Warpage of the semiconductor die or substrate may result in misalignment of the interconnect structures used to connect the semiconductor die and substrates.

In flip-chip applications with a high input/output (I/O) count or fine interconnect pitch, costs can be reduced and the density of the interconnect increased by forming the interconnects using conductive columns and a reduced volume of solder. Reducing the volume of solder may reduce misalignment tolerance during interconnect manufacture and may result in poor joint reliability.

SUMMARY OF THE INVENTION

A need exists for reliable reduced-cost high-density interconnect within semiconductor devices. Accordingly, in one embodiment, the present invention is a method of making a semiconductor device comprising the steps of providing a substrate, providing a semiconductor die, forming a plurality of bumps over the substrate or a first surface of the semiconductor die, forming a plurality of conductive columns over the substrate or the first surface of the semiconductor die, disposing the semiconductor die over the substrate, providing a collet including a first cavity, mounting the collet over the semiconductor die with a second surface of the semiconductor die opposite the first surface disposed within the first cavity, applying a force to the collet to hold the bumps to the conductive columns while reflowing the bumps to make electrical connection to the conductive columns, and removing the collet.

In another embodiment, the present invention is a method of making a semiconductor device comprising the steps of providing a substrate including a first interconnect structure, providing a semiconductor die including a second interconnect structure, disposing the semiconductor die over the substrate, providing a collet including a first cavity, disposing a collet over the semiconductor die at least partially within the first cavity, and applying a force to the collet while mating the first interconnect structure to the second interconnect structure.

In another embodiment, the present invention is a method of making a semiconductor device comprising the steps of providing a substrate, providing a semiconductor die, disposing the semiconductor die over the substrate, disposing a collet including a first cavity over the semiconductor die, and applying a force to the collet while mating the semiconductor die to the substrate.

In another embodiment, the present invention is a semiconductor device comprising a substrate, a semiconductor die disposed over the substrate, and a collet including a first cavity disposed over the semiconductor die, wherein a force is applied to the collet while mating the semiconductor die to the substrate.

BRIEF DESCRIPTION OF THE DRAWINGS

FIGS. 3a-3g illustrate a semiconductor wafer with a plurality of semiconductor die separated by a saw street and a method of forming conductive columns on the semiconductor wafer;

FIGS. 4a-4j illustrate a method of manufacturing a flip-chip package;

FIGS. 6a-6d illustrate in conjunction with FIGS. 4a-4c, 4i, and 4j an alternative embodiment of the method of manufacturing a flip-chip package;

FIGS. 7a-7d illustrate in conjunction with FIGS. 4a-4c, 4i, and 4j another embodiment of the method of manufacturing a flip-chip package.

DETAILED DESCRIPTION OF THE DRAWINGS

Figure 1:
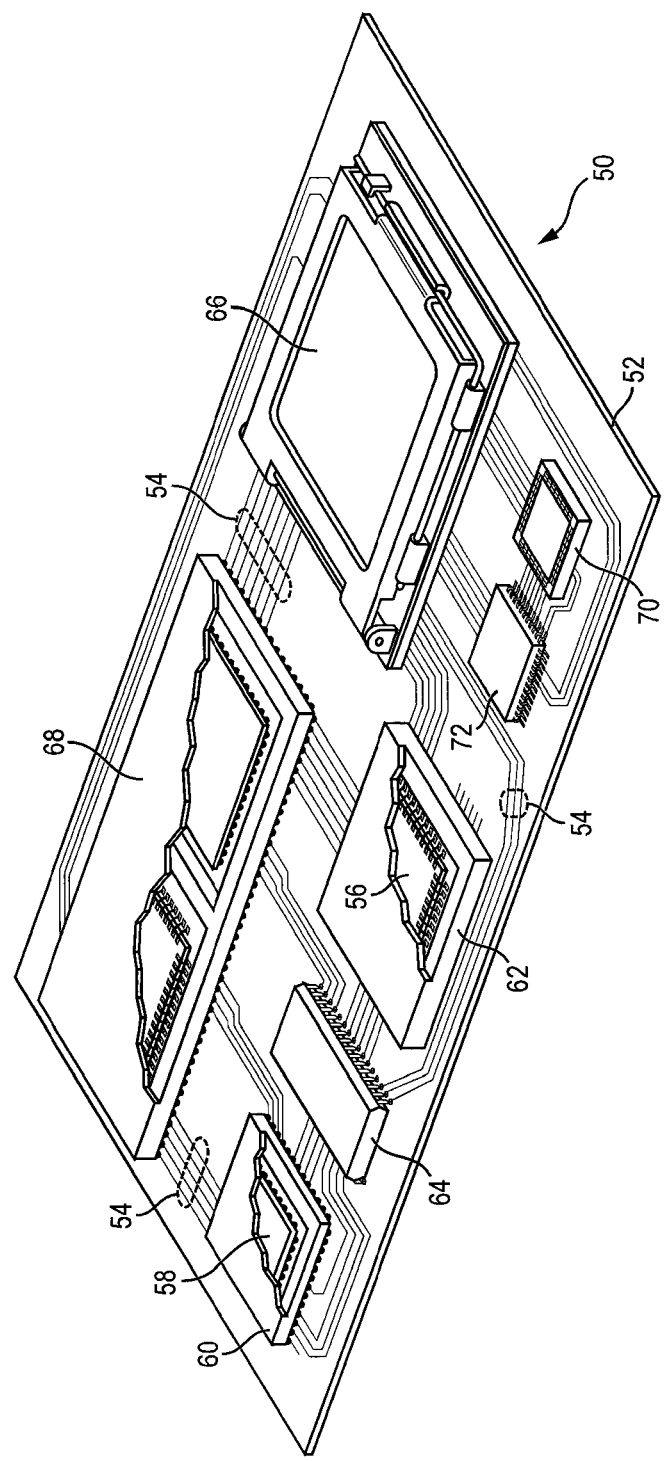
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
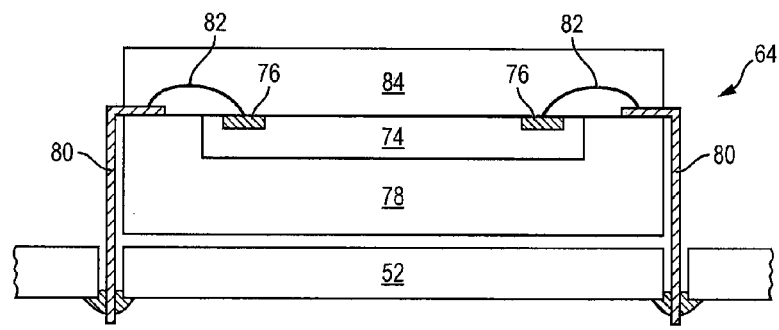
FIGS. 2a-2c illustrate further detail of the representative semiconductor packages mounted to the PCB.
Figure 2B:
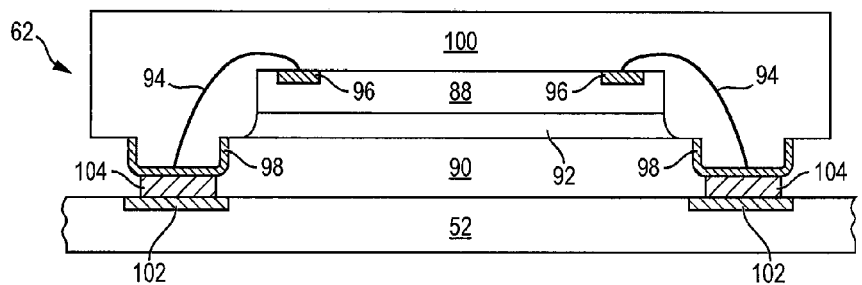
Figure 2C:
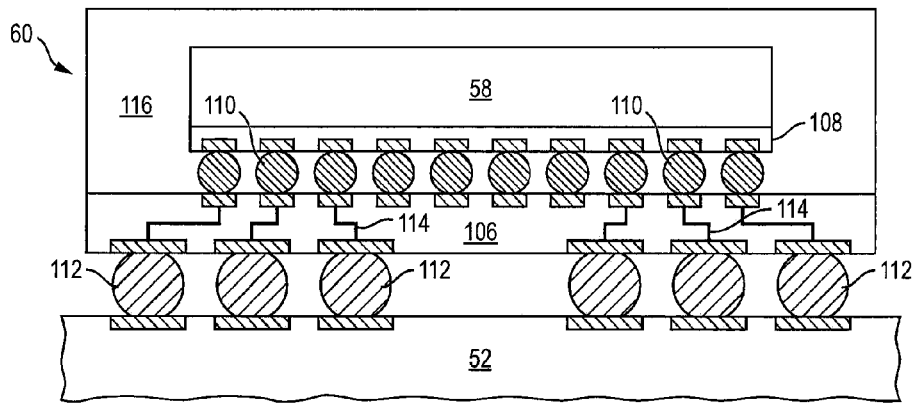

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
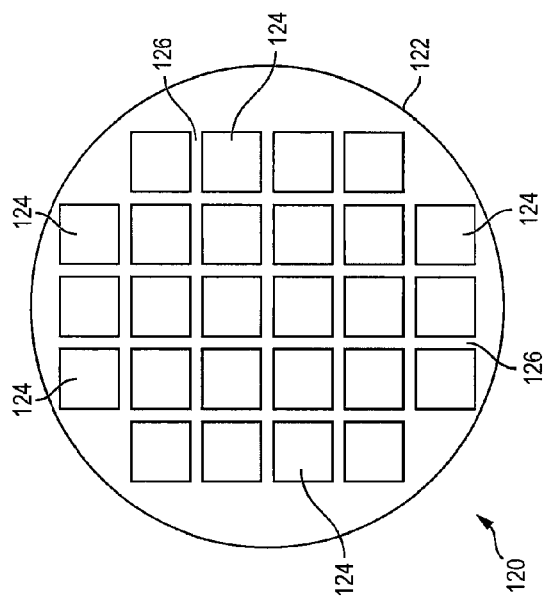

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
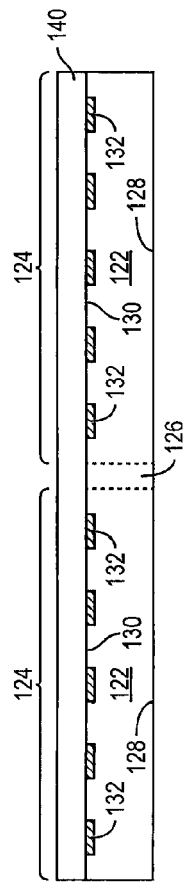

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed using a patterning and metal deposition process such as printing, PVD, CVD, sputtering, electrolytic plating, and electroless plating. Conductive layer 132 can be one or more layers of Al, Cu, Sn, Ti, Ni, Au, Ag, or other suitable electrically conductive material. Conductive layer 132 operates as contact pads that are electrically connected to the circuits on active surface 130 of semiconductor wafer 120. Contact pads 132 can be disposed a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die. In one embodiment, conductive layer 132 can have a circular, rectangular, or other suitable shape.

A patterning or photoresist layer 140 is formed over active surface 130 and conductive layer 132 using printing, spin coating, or spray coating. In some embodiments that utilize an insulating layer for patterning, the insulating layer can include one or more layers of silicon dioxide (SiO2), silicon nitride (Si3N4), silicon oxynitride (SiON), tantalum pentoxide (Ta2O5), aluminum oxide (Al2O3), or other material having similar structural properties. A portion of photoresist layer 140 is removed by an etching process to form vias 142 that extend down to and expose conductive layer 132, as shown in FIG. 3c. Alternatively, vias 142 are formed by laser direct ablation (LDA) using laser 144.

In FIG. 3d, an electrically conductive material is deposited into vias 142 over conductive layer 132 using a patterning and metal deposition process such as printing, sputtering, electrolytic plating, and electroless plating to form conductive pillars or columns 136. The conductive material can be one or more layers of Al, Cu, Sn, Ti, Ni, Au, Ag, tungsten (W), or other suitable electrically conductive material. Conductive columns 136 are electrically connected to conductive layer 132.

Conductive columns 136 can include a multiple metal stack having an adhesion layer, a barrier layer, and a seed or wetting layer. An adhesion layer is formed over conductive layer 132 and can be titanium (Ti), titanium nitride (TiN), titanium tungsten (TiW), Al, or chromium (Cr). A barrier layer is formed over an adhesion layer and can be Ni, nickel vanadium (NiV), platinum (Pt), palladium (Pd), TiW, or chromium copper (CrCu). A barrier layer inhibits diffusion of Cu into active areas of the die. A seed layer can be Cu, Ni, NiV, Au, or Al. A seed layer is formed over a barrier layer and acts as an intermediate conductive layer between conductive layer 132 and conductive columns 136. Conductive columns 136 can be formed with concave upper surfaces as shown in FIG. 3d. Alternatively, conductive columns 138 can be formed with flat upper surfaces, as shown in FIG. 3e.

Figure 3F:
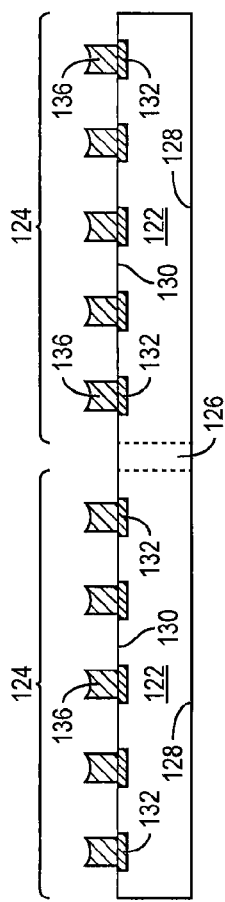

Continuing from FIG. 3d, the remaining portions of photoresist layers 140 are removed by a chemical stripping process to expose active surface 130 and conductive columns 136, as shown in FIG. 3f.

Figure 3G:
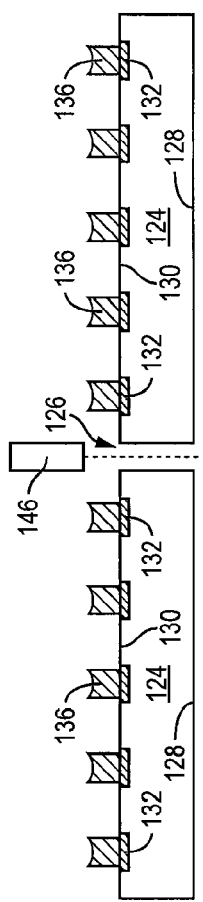

In FIG. 3g, semiconductor wafer 120 is singulated through saw streets 126 using a saw blade or laser cutting tool 146 into individual semiconductor die 124. Alternatively, semiconductor wafer 120 can be singulated using back-grinding, stealth dicing, or scribing.

Figure 4A:
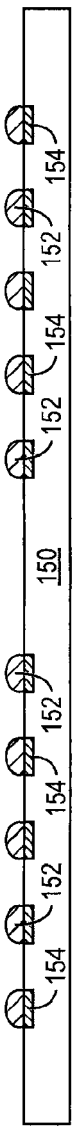

FIGS. 4a-4m illustrate, in relation to FIGS. 1 and 2a-2c, a method for mounting semiconductor die to a substrate. FIG. 4a shows a substrate or PCB 150 suitable for mounting semiconductor die. Substrate 150 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 150 contains one or more laminated insulating or dielectric layers.

An electrically conductive layer 154 is formed over substrate 150 using a patterning and metal deposition process, such as silk screen printing, photoengraving, PCB milling, electroless plating, or electroplating process. Conductive layer 154 can be one or more layers of Al, Cu, Sn, Ni, Au, Ag, or other suitable electrically conductive material. Conductive layer 154 operates as conductive traces or contact pads for electrical interconnect. Portions of conductive layer 154 are electrically common or electrically isolated according to the design and function of the semiconductor die to be mounted to substrate 150.

An electrically conductive pre-solder or bump material is deposited over the exposed conductive layer 154 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 152. In some applications, bumps 152 are reflowed a second time to improve electrical contact to conductive layer 154. Bumps 152 can also be compression bonded to conductive layer 154. Bumps 152 represent one type of interconnect structure that can be formed over conductive layer 154. The interconnect structure can also use stud bump, micro bump, or other electrical interconnect.

In FIG. 4b, substrate 150 is mounted over carrier 160 for support. In one embodiment, carrier 160 supports the entirety of substrate 150. In an alternate embodiment, carrier 160 supports only a portion of substrate 150. For example, carrier 160 may only support portions of substrate 150 near the edges of the substrate, or may only support portions of substrate 150 near the edges and center of the substrate. In one embodiment, carrier 160 may be configured to induce tension or compression within portions of substrate 150.

Semiconductor die 124 from FIGS. 3a-3g are disposed over substrate 150 using a pick and place operation with active surface 130 oriented toward substrate 150. Semiconductor die 124 are positioned so that conductive columns 136 are in contact with bumps 152.

In FIG. 4c, the temperature of bumps 152 is elevated to melt the bumps. Bumps 152 can be heated by convection, conduction, condensation, induction, or radiation alone or in combination. Semiconductor die 124 are pressed toward substrate 150 and bumps 152 reflow. Cohesion force between conductive columns 136 and bumps 152 causes the conductive columns and bumps to align with each other. Conductive columns 136b and 136c make electrical and metallurgical connection to bumps 152b and 152c, respectively. Due to warpage of substrate 150, conductive column 136a may fail to make contact or fail to make a good joint with bump 152a. Due to warpage of semiconductor die 124b, conductive column 136d may fail to make contact or fail to make a good joint with bump 152d. In one embodiment, bumps 152 are allowed to cool before further processing.

Figure 4E:
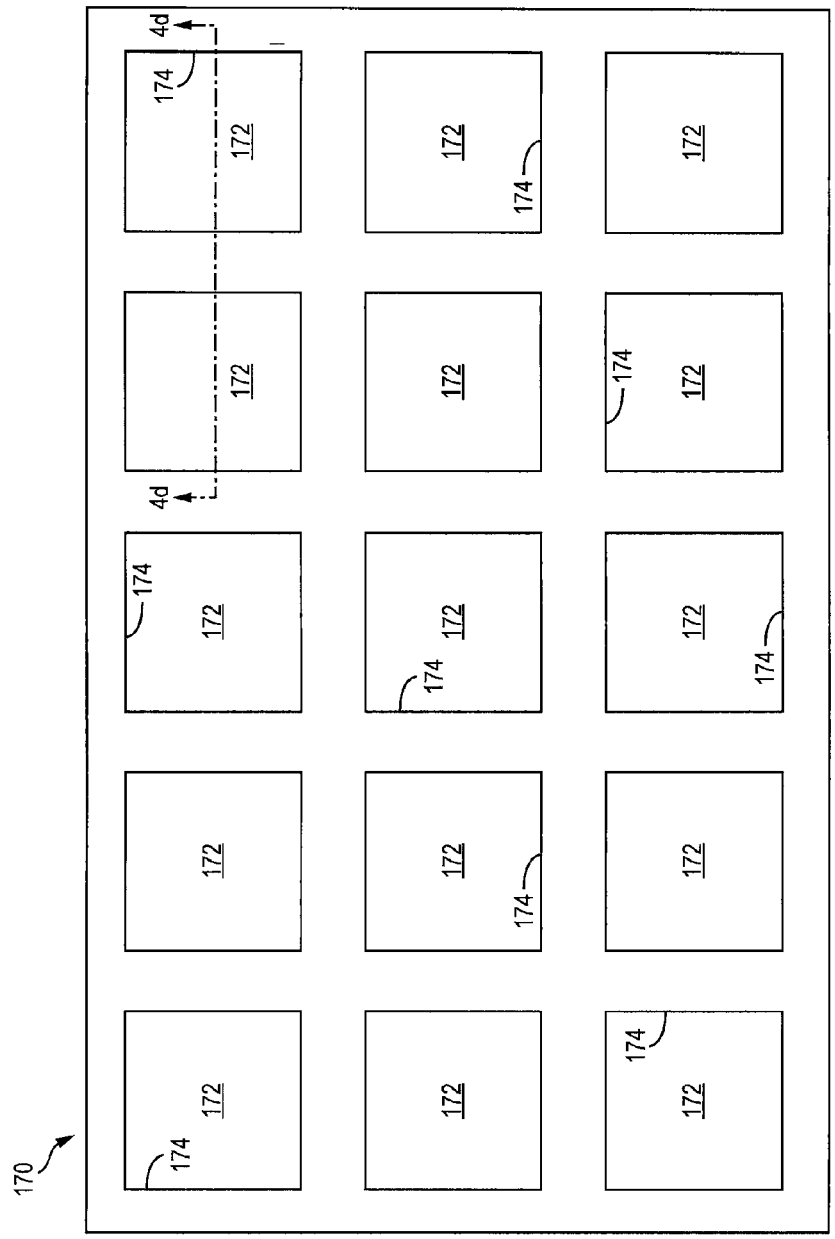

In FIG. 4d, chip collet 170 contains recessed cavities 172 including cavity sidewalls 174. Cavities 172 are adapted to fit around semiconductor die 124. Collet 170 comprises material of appropriate stiffness, dimensional stability, thermal conductivity, thermal coefficient of expansion (TCE), and temperature tolerance for the intended application. For example, collet 170 can include aluminum, titanium, or fiberglass composites. Collet 170 can comprise materials selected to match the TCE of collet 170 with the TCE of substrate 150. Collet 170 can also comprise materials selected to facilitate or impede the transfer of heat to or from bumps 152, semiconductor die 124, or substrate 150. Different semiconductor die 124 and/or a different substrate 150 may require the use of collets 170 with different configurations and different materials, depending on the dimensions and compositions of the bumps, semiconductor die, and substrate. FIG. 4e shows a plan view of collet 170 comprising cavities 172 including sidewalls 174.

In FIG. 4f, collet 170 is positioned over semiconductor die 124 on substrate 150 with cavities 172 oriented towards the substrate. Cavities 172 and semiconductor die 124 are aligned and moved one toward the other so that back surfaces 128 of the semiconductor die contact collet 170 within the cavities, as shown in FIG. 4g. Cavities 172 of collet 170 have a footprint larger than the footprint of semiconductor die 124 and sufficient to contain the semiconductor die. The footprint of cavities 172 may permit sidewalls 174 of the cavities to not contact semiconductor die 124 when dimensional changes occur in the semiconductor die, collet 170, and/or substrate 150 as a result of heat, pressure, humidity, chemical reactions, or other factors, i.e., the footprint of the cavities may allow gaps between the sidewalls of the cavities and the semiconductor die. The footprint of cavities 172 may also permit sidewalls 174 of the cavities to not contact semiconductor die 124 when inaccuracies in the positioning of collet 170, substrate 150, or semiconductor die 124 occur. In one embodiment, cavities 172 include a depth such that collet 170 does not contact substrate 150. Alternatively, cavities 172 include a depth such that collet 170 does contact substrate 150. In one embodiment, collet 170 includes a friction-reducing material on surfaces of cavities 172. Alternatively, a friction-reducing material may be formed on surfaces of semiconductor die 124 before collet 170 is brought into contact with the semiconductor die.

Figure 4H:
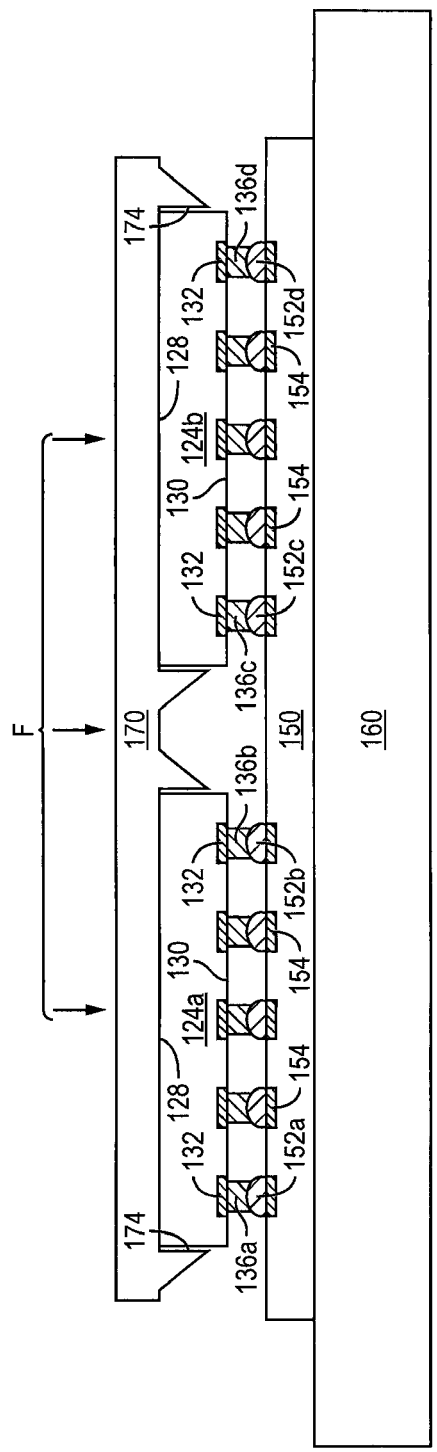
Figure 4I:
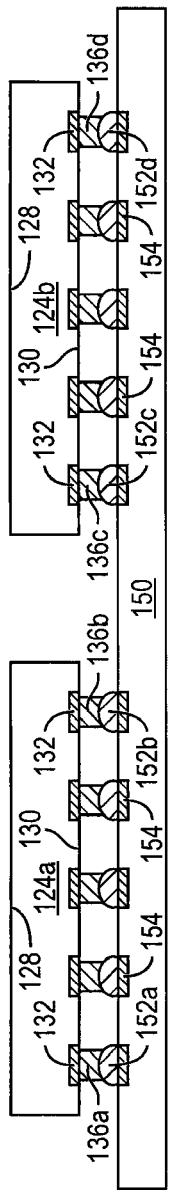

In FIG. 4h, a force F is applied to press collet 170 onto semiconductor die 124. Force F can be generated by the weight of collet 170 or can be applied to the collet by another device. Warpage of the substrate 150 and of semiconductor die 124b is reduced by the force applied by collet 170. In one embodiment, collet 170 applies only a force perpendicular to the surface of substrate 150 or semiconductor die 124. The temperature of bumps 152 is elevated to melt the bumps and bumps 152 reflow. Bumps 152 can be heated by convection, conduction, condensation, induction, or radiation alone or in combination. Cohesion force between conductive columns 136 and bumps 152 causes the conductive columns and bumps to remain aligned with each other. Conductive columns 136 make electrical and metallurgical connection to bumps 152. Bumps 152 are allowed to cool. Collet 170 and carrier 160 are removed, as shown in FIG. 4i.

Figure 4J:
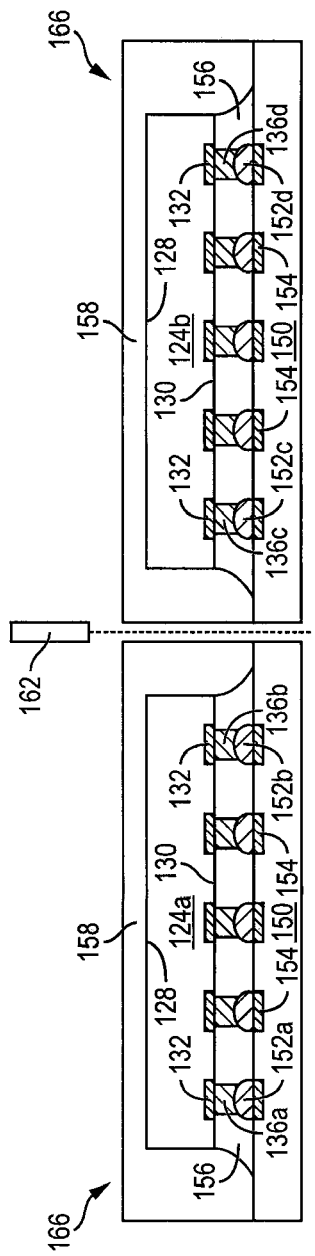

FIG. 4j shows further processing of substrate 150 and semiconductor die 124 after removal of collet 170 and carrier 160. A capillary underfill material (CUF) or encapsulant material 156 is injected between semiconductor die 124 and substrate 150 around conductive columns 136 and bumps 152. CUF 156 can be polymer composite material, such as epoxy resin with filler, epoxy acrylate with filler, or polymer with proper filler. CUF 156 is non-conductive and environmentally protects the semiconductor device from external elements and contaminants. Alternatively, a suitable underfill material other than CUF 156 may be formed between semiconductor die 124 and substrate 150 prior to reflowing bumps 152.

An encapsulant or molding compound 158 is deposited over semiconductor die 124 and carrier 150 using a paste printing, compressive molding, transfer molding, liquid encapsulant molding, vacuum lamination, spin coating, or other suitable applicator. Encapsulant 158 can be polymer composite material, such as epoxy resin with filler, epoxy acrylate with filler, or polymer with proper filler. Encapsulant 158 is non-conductive and environmentally protects the semiconductor device from external elements and contaminants. FIG. 4j further shows semiconductor die 124 and carrier 150 singulated using a saw blade or laser cutting tool 162 to form individual flip-chip packages 166.

Figure 5:
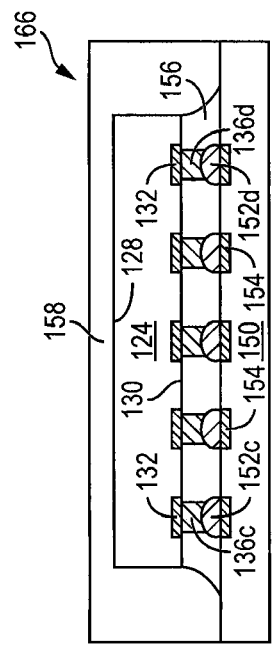
FIG. 5 illustrates a flip-chip package according to the method disclosed in FIGS. 4a-4j.

FIG. 5 shows flip-chip package 166 produced using the process disclosed in FIGS. 3a-3g and 4a-4j. Semiconductor die 124 is mounted over substrate 150. Conductive columns 136 are electrically connected to active and passive circuitry within semiconductor die 124. Conductive columns 136 make electrical and metallurgical connection to bumps 152 on substrate 150. CUF 156 and encapsulant 158 protect semiconductor die 124, conductive columns 136, and bumps 152 from the external elements and mechanical stress. By using collet 170 with cavities 172, good joints can be formed between each conductive column 136 and the corresponding bump 152 without forming solder material on the conductive columns prior to disposing the conductive columns in contact with the bumps. Good joints can be formed using small bumps 152 including when semiconductor die 124 comprises a large number of closely-spaced conductive columns 136 and substrate 150 includes a corresponding large number of closely-spaced bumps. Furthermore, good joints can be formed between conductive columns 136 and bumps 152 when semiconductor die 124 and/or substrate 150 are susceptible to warpage during the reflowing of the bumps, such as when the semiconductor die and/or substrate are thin.

Figure 8:
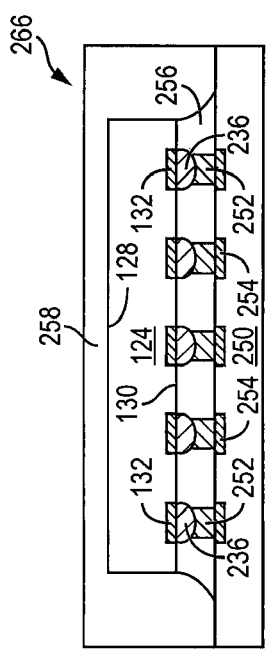
FIG. 8 illustrates another flip-chip package according to the method disclosed in FIGS. 4a-4j.

FIG. 8 shows an alternative embodiment of flip-chip package 266 produced using the process disclosed in FIGS. 3a-3g and 4a-4j. FIG. 8 differs from FIG. 5 in that a) conductive columns 252 are formed on conductive layer 254 of substrate 250 instead of being formed on semiconductor die 124 and b) bumps 236 are formed on semiconductor die 124 instead of being formed on substrate 250. Semiconductor die 124 is mounted over substrate 250. Bumps 236 are electrically connected to active and passive circuitry within semiconductor die 124. Bumps 236 make electrical and metallurgical connection to conductive columns 252 on substrate 250. CUF 256 and encapsulant 258 protect semiconductor die 124, bumps 236, and conductive columns 252 from the external elements and mechanical stress. By using collet 170 with cavities 172, good joints can be formed between each bump 236 and the corresponding conductive columns 252 without forming solder material on the conductive columns prior to disposing the conductive columns in contact with the bumps. Good joints can be formed using small bumps 236 including when semiconductor die 124 comprises a large number of closely-spaced bumps 236 and substrate 250 includes a corresponding large number of closely-spaced conductive columns 252. Furthermore, good joints can be formed between bumps 236 and conductive columns 252 when semiconductor die 124 and/or substrate 250 are susceptible to warpage during the reflowing of the bumps, such as when the semiconductor die and/or substrate are thin.

FIGS. 6a-6c show an alternative embodiment of the steps shown in FIGS. 4f-4h using an embodiment of collet 180 combining features of collet 170 of FIGS. 4d and 4e with additional features. Continuing from FIG. 4c, in FIG. 6a collet 180 includes first cavities 182 similar to cavities 172 in collet 170. First cavities 182 include sidewalls 184. Collet 180 further includes second cavities 186 formed in upper surfaces of first cavities 182. Like collet 170, collet 180 comprises material of appropriate stiffness, dimensional stability, thermal conductivity, thermal coefficient of expansion (TCE), and temperature tolerance for the intended application. For example, collet 180 can include aluminum, titanium, or fiberglass composites. Collet 180 can comprise materials selected to match the TCE of collet 180 with the TCE of substrate 150. Collet 180 can also comprise materials selected to facilitate or impede the transfer of heat to or from bumps 152, semiconductor die 124, or substrate 150. Different semiconductor die 124 and/or a different substrate 150 may require the use of collets 180 with different configurations and different materials, depending on the dimensions and compositions of the bumps, semiconductor die, and substrate.

FIG. 6d shows an alternative embodiment of collet 180 including openings 187 extending from cavities 182 to a surface of collet 180 opposite cavities 182. Openings 187 may provide visual access to semiconductor die 124 or substrate 150 for inspection or alignment. Openings 187 may also facilitate the passage of material or energy to or from semiconductor die 124 or substrate 150 during the reflow process described in detail below.

Continuing with FIG. 6a, collet 180 is positioned over semiconductor die 124 on substrate 150 with cavities 182 oriented towards the substrate. Cavities 182 and semiconductor die 124 are aligned and moved one toward the other so that back surfaces 128 of the semiconductor die contact collet 180 within the cavities, as shown in FIG. 6b. Cavities 182 of collet 180 have a footprint larger than the footprint of semiconductor die 124 and sufficient to contain the semiconductor die. The footprint of cavities 182 may permit sidewalls 184 of the cavities to not contact semiconductor die 124 when dimensional changes occur in the semiconductor die, collet 180, and/or substrate 150 as a result of heat, pressure, humidity, chemical reactions, or other factors. The footprint of cavities 182 may also permit sidewalls 184 of the cavities to not contact semiconductor die 124 when inaccuracies in the positioning of collet 180, substrate 150, or semiconductor die 124 occur. In one embodiment, cavities 182 include a depth such that collet 180 does not contact substrate 150. Alternatively, cavities 182 include a depth such that collet 180 may contact substrate 150. In one embodiment, collet 180 includes a friction-reducing material on surfaces of cavities 182. Alternatively, a friction-reducing material may be formed on surfaces of semiconductor die 124 before collet 180 is brought into contact with the semiconductor die.

In FIG. 6c, a force F is applied to press collet 180 onto semiconductor die 124. Force F can be generated by the weight of collet 180 or can be applied to the collet by another device. Warpage of the substrate 150 and of semiconductor die 124b is reduced by the force applied by collet 180. In one embodiment, collet 180 applies only a force perpendicular to the surface of substrate 150 or semiconductor die 124. The temperature of bumps 152 is elevated to melt the bumps and bumps 152 reflow. Bumps 152 can be heated by convection, conduction, condensation, induction, or radiation alone or in combination. Cohesion force between conductive columns 136 and bumps 152 causes the conductive columns and bumps to remain aligned with each other. Conductive columns 136 make electrical and metallurgical connection to bumps 152. Bumps 152 are allowed to cool. Processing then continues as shown in FIGS. 4i and 4j. FIG. 5 shows flip-chip package 166 produced using the process disclosed in FIGS. 3a-3g, 4a-4c, 6a-6c, and 4i-4j.

FIGS. 7a-7c show an alternative embodiment of the steps shown in FIGS. 4f-4h using an embodiment of collet 190 combining features of collet 170 of FIGS. 4d and 4e with additional features. Continuing from FIG. 4c, in FIG. 7a collet 190 includes first cavities 192 similar to cavities 172 in collet 170. First cavities 192 include sidewalls 194. Collet 190 further includes a plurality of second cavities 196 and third cavities 198 formed within cavities 192. Second cavities 196 are formed in upper surfaces of first cavities 192, and third cavities 198 are formed in sidewalls 194 of first cavities 192. Like collet 170, collet 190 comprises material of appropriate stiffness, dimensional stability, thermal conductivity, thermal coefficient of expansion (TCE), and temperature tolerance for the intended application. For example, collet 190 can include aluminum, titanium, or fiberglass composites. Collet 190 can comprise materials selected to match the TCE of collet 190 with the TCE of substrate 150. Collet 190 can also comprise materials selected to facilitate or impede the transfer of heat to or from bumps 152, semiconductor die 124, or substrate 150. Different semiconductor die 124 and/or a different substrate 150 may require the use of collets 190 with different configurations and different materials, depending on the dimensions and compositions of the bumps, semiconductor die, and substrate.

FIG. 7d shows an alternative embodiment of collet 190 including openings 197 extending from cavities 192 to a surface of collet 190 opposite cavities 192. Openings 197 may provide visual access to semiconductor die 124 or substrate 150 for inspection or alignment. Openings 197 may also facilitate the passage of material or energy to or from semiconductor die 124 or substrate 150 during the reflow process described in detail below.

Continuing with FIG. 7a, collet 190 is positioned over semiconductor die 124 on substrate 150 with cavities 192 oriented towards the substrate. Cavities 192 and semiconductor die 124 are aligned and moved one toward the other so that back surfaces 128 of the semiconductor die contact collet 190 within the cavities, as shown in FIG. 7b. Cavities 192 of collet 190 have a footprint larger than the footprint of semiconductor die 124 and sufficient to contain the semiconductor die. The footprint of cavities 192 may permit sidewalls 194 of the cavities to not contact semiconductor die 124 when dimensional changes occur in the semiconductor die, collet 190, and/or substrate 150 as a result of heat, pressure, humidity, chemical reactions, or other factors. The footprint of cavities 192 may also permit sidewalls 194 of the cavities to not contact semiconductor die 124 when inaccuracies in the positioning of collet 190, substrate 150, or semiconductor die 124 occur. In one embodiment, cavities 192 include a depth such that collet 190 does not contact substrate 150. Alternatively, cavities 192 include a depth such that collet 190 may contact substrate 150. In one embodiment, collet 190 includes a friction-reducing material on surfaces of cavities 192. Alternatively, a friction-reducing material may be formed on surfaces of semiconductor die 124 before collet 190 is brought into contact with the semiconductor die.

In FIG. 7c, a force F is applied to press collet 190 onto semiconductor die 124. Force F can be generated by the weight of collet 190 or can be applied to the collet by another device. Warpage of the substrate 150 and of semiconductor die 124b is reduced by the force applied by collet 190. In one embodiment, collet 190 applies only a force perpendicular to the surface of substrate 150. The temperature of bumps 152 is elevated to melt the bumps and bumps 152 reflow. Bumps 152 can be heated by convection, conduction, condensation, induction, or radiation alone or in combination. Cohesion force between conductive columns 136 and bumps 152 causes the conductive columns and bumps to remain aligned with each other. Conductive columns 136 make electrical and metallurgical connection to bumps 152. Bumps 152 are allowed to cool. Processing then continues as shown in FIGS. 4i and 4j. FIG. 5 shows flip-chip package 166 produced using the process disclosed in FIGS. 3a-3g, 4a-4c, 7a-7c, and 4i-4j.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   providing a plurality of semiconductor die;
   forming a plurality of bumps over the substrate or semiconductor die;
   forming a plurality of conductive columns over the substrate or semiconductor die;
   disposing the semiconductor die over the substrate;
   performing a first reflow of the bumps with the first reflow connecting a first portion of the bumps to a first portion of the conductive columns and failing to connect a second portion of the bumps to a second portion of the conductive columns;
   providing a collet including a body with sidewalls that form a plurality of first cavities in the body of the collet;
   disposing the collet over the semiconductor die after performing the first reflow and with the semiconductor die extending beyond the sidewalls of the collet to leave a gap between the substrate and sidewalls of the collet; and
   applying a force to the collet while performing a second reflow of the bumps to connect the second portion of the bumps and second portion of the conductive columns.

2. The method of claim 1, further including forming a second cavity in a surface of the first cavities of the collet.

3. The method of claim 1, further including forming a second cavity in the sidewalls of the collet.

4. The method of claim 1, further including removing the collet.

5. The method of claim 1, further including forming the conductive columns devoid of solder.

6. The method of claim 1, further including:
   depositing an underfill material between the semiconductor die and the substrate; and
   depositing an encapsulant over the semiconductor die and substrate.

7. The method of claim 1, further including forming an opening in the collet.

8. A method of making a semiconductor device, comprising:
   providing a substrate including a first bump and second bump;
   providing a semiconductor die including a first conductive column and second conductive column;
   disposing the semiconductor die over the substrate;
   performing a first reflow of the first and second bumps with the first reflow electrically connecting the first bump to the first conductive column and failing to connect the second bump to the second conductive column;
   providing a collet including a body with sidewalls that form a first cavity in the body of the collet;
   disposing the collet on the semiconductor die after disposing the semiconductor die over the substrate with the semiconductor die extending beyond the sidewalls of the collet to leave a gap between the substrate and sidewalls of the collet; and applying a force to the collet after performing the first reflow and while mating the second bump to the second conductive column, wherein mating the second bump and second conductive column includes performing a second reflow of the first and second bumps.

9. The method of claim 8, further including forming a second cavity in a surface of the first cavity of the collet.

10. The method of claim 8, further including forming a second cavity in the sidewalls of the collet.

11. The method of claim 8, further including forming the first and second conductive columns devoid of solder.

12. The method of claim 8, further including:
depositing an underfill material between the semiconductor die and the substrate; and
depositing an encapsulant over the semiconductor die and substrate.

13. The method of claim 8, further including forming an opening in the collet.

* * * * *